United States Patent
Lim et al.

(10) Patent No.: US 9,991,287 B2
(45) Date of Patent: Jun. 5, 2018

(54) THIN FILM TRANSISTOR ARRAY PANEL

(71) Applicant: Samsung Display Co., Ltd., Yongin-si (KR)

(72) Inventors: Ji Hun Lim, Hwaseong-si (KR); Jong Baek Seon, Yongin-si (KR); Kyoung Seok Son, Seoul (KR); Eok Su Kim, Seoul (KR); Tae Sang Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/478,386

(22) Filed: Apr. 4, 2017

(65) Prior Publication Data
US 2017/0323905 A1 Nov. 9, 2017

(30) Foreign Application Priority Data
May 9, 2016 (KR) ........................ 10-2016-0056270

(51) Int. Cl.
*H01L 29/78* (2006.01)
*H01L 29/66* (2006.01)
*H01L 27/12* (2006.01)
*H01L 29/786* (2006.01)

(52) U.S. Cl.
CPC ........ *H01L 27/1225* (2013.01); *H01L 27/124* (2013.01); *H01L 27/1259* (2013.01); *H01L 29/66969* (2013.01); *H01L 29/7869* (2013.01); *H01L 29/78633* (2013.01)

(58) Field of Classification Search
CPC ........... H01L 127/124; H01L 127/1225; H01L 127/1259; H01L 29/66969; H01L 29/78633; H01L 29/7869
See application file for complete search history.

(56) References Cited

U.S. PATENT DOCUMENTS

| 7,943,447 | B2 | 5/2011 | Kakkad |
| 8,232,551 | B2 | 7/2012 | Kim et al. |
| 8,587,093 | B2 | 11/2013 | Mardilovich et al. |
| 8,896,065 | B2 | 11/2014 | Kisdarjono et al. |
| 2005/0037551 | A1 | 2/2005 | Moriguchi et al. |

(Continued)

FOREIGN PATENT DOCUMENTS

| KR | 10-0290919 | 3/2001 |
| KR | 10-2010-0097002 | 9/2010 |
| KR | 10-2012-0124316 | 11/2012 |

OTHER PUBLICATIONS

Cheng-Han Wu et al., Self-aligned top-gate coplanar In—Ga—Zn—O Thin-Film-Transistors, Journal of Display Technology, vol. 5, No. 12, Dec. 2009, pp. 515-519.

(Continued)

*Primary Examiner* — Fazli Erdem
(74) *Attorney, Agent, or Firm* — H.C. Park & Associates, PLC

(57) ABSTRACT

A thin film transistor array panel includes: a substrate; a semiconductor layer disposed on the substrate; a gate electrode disposed on the semiconductor layer; and a source electrode and a drain electrode disposed on the semiconductor layer to not overlap the gate electrode, wherein a first edge of the gate electrode is aligned with a second edge of the semiconductor layer in a direction that is perpendicular to the substrate.

10 Claims, 12 Drawing Sheets

(56) References Cited

U.S. PATENT DOCUMENTS

| | | |
|---|---|---|
| 2006/0068532 A1 | 3/2006 | Schuele et al. |
| 2006/0166415 A1 | 7/2006 | Afentakis et al. |
| 2009/0224250 A1 | 9/2009 | Kisdarjono et al. |
| 2009/0278120 A1 | 11/2009 | Lee et al. |
| 2012/0080663 A1 | 4/2012 | Lee et al. |
| 2013/0256652 A1* | 10/2013 | Lee ................ H01L 29/786 257/43 |
| 2013/0320328 A1* | 12/2013 | Lee ................ H01L 29/7869 257/43 |
| 2014/0042429 A1* | 2/2014 | Park ............... H01L 29/66742 257/43 |
| 2014/0138684 A1* | 5/2014 | Lee ................ H01L 29/786 257/43 |
| 2014/0183522 A1* | 7/2014 | Cha ............... H01L 29/66969 257/43 |
| 2014/0247403 A1* | 9/2014 | Mun ............... G02F 1/13338 349/12 |
| 2015/0137750 A1 | 7/2015 | Kim et al. |
| 2015/0214248 A1 | 7/2015 | Chou |

OTHER PUBLICATIONS

Niko Munzenrieder et al., Flexible self-aligned double-gate IGZO TFT, IEEE Electron Device Letters, vol. 35, No. 1, Jan. 2014, pp. 69-71.

\* cited by examiner

THIN FILM TRANSISTOR ARRAY PANEL

CROSS-REFERENCE TO RELATED APPLICATION

This application claims priority from and the benefit of Korean Patent Application No. 10-2016-0056270, filed on May 9, 2016, which is hereby incorporated by reference for all purposes as if fully set forth herein

BACKGROUND

Field

The present disclosure relates to a thin film transistor array panel.

Discussion of the Background

Thin film transistors (TFTs) are used for various electronic devices such as display devices. For example, a thin film transistor is used as a switching element or a driving element in a display device such as a liquid crystal display (LCD) and an organic light emitting diode display (OLED display).

The thin film transistor includes a gate electrode, a source electrode, a drain electrode facing the source electrode, and a semiconductor electrically connected to the source electrode and the drain electrode, wherein the semiconductor is an important factor for determining the characteristics of the thin film transistor.

Silicon (Si) is frequently used as such a semiconductor. Silicon is divided into amorphous silicon and polycrystalline silicon depending on its crystal form. Amorphous silicon has a relatively simple manufacturing process and low charge mobility, which limits fabrication of high performance thin film transistors. Polycrystalline silicon has high charge mobility, but requires a step of crystallizing silicon, which is relatively expensive and complicated in process.

To complement amorphous silicon and polycrystalline silicon, studies on thin film transistors using oxide semiconductors with higher electron mobility, higher on/off ratios, lower cost than polycrystalline silicon, and higher uniformity than amorphous silicon are being developed.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a thin film transistor array panel having advantages of being capable of preventing energy level distortion of a channel caused by a gate electrode that is overlapped with a side surface of the channel.

Additional aspects will be set forth in the detailed description which follows, and, in part, will be apparent from the disclosure, or may be learned by practice of the inventive concepts.

An exemplary embodiment of the present invention discloses a thin film transistor array panel including: a substrate; a semiconductor layer disposed on the substrate; a gate electrode disposed on the semiconductor layer; and a source electrode and a drain electrode disposed on the semiconductor layer to not overlap the gate electrode, wherein a first edge of the gate electrode is aligned with a second edge of the semiconductor layer in a direction that is perpendicular to the substrate.

In the semiconductor layer, in a plan view, a first width in a first direction may be wider than a second width in a second direction that is perpendicular to the first direction.

A distance between the first edge of the gate electrode and the second edge of the semiconductor layer may be within 3 μm.

In the semiconductor layer, in a plan view, a first width in a first direction may be wider than a second width in a second direction that is perpendicular to the first direction, a portion of the semiconductor layer may serve as a channel, the channel may be overlapped with the gate electrode in a direction that is perpendicular to the substrate, and an edge of the channel parallel to the first direction may not be overlapped with the gate electrode at a side surface of the channel.

The thin film transistor array panel may further include a light-blocking film disposed between the substrate and the semiconductor layer.

The light-blocking film may not be overlapped with the source electrode and a drain electrode.

A portion of the light-blocking film may be connected with the gate electrode.

The thin film transistor array panel may further include a voltage line disposed between the substrate and the semiconductor layer, the light-blocking film may be a portion of the voltage line, and a portion of the light-blocking film may be connected with the drain electrode.

A ground voltage of 0 V may be supplied to the voltage line.

The semiconductor layer may include an oxide semiconductor.

The thin film transistor array panel may further include a gate insulating layer disposed between the semiconductor layer and the gate electrode, and the gate insulating layer may not be overlapped with the source electrode and a drain electrode.

The thin film transistor array panel may further include a pixel electrode connected with a portion of the drain electrode.

According to the thin film transistor array panel of the exemplary embodiments, it is possible to improve reliability of the thin film transistor by preventing an influence of the gate electrode from the side surface of the channel and deterioration of efficiency of the thin film transistor.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
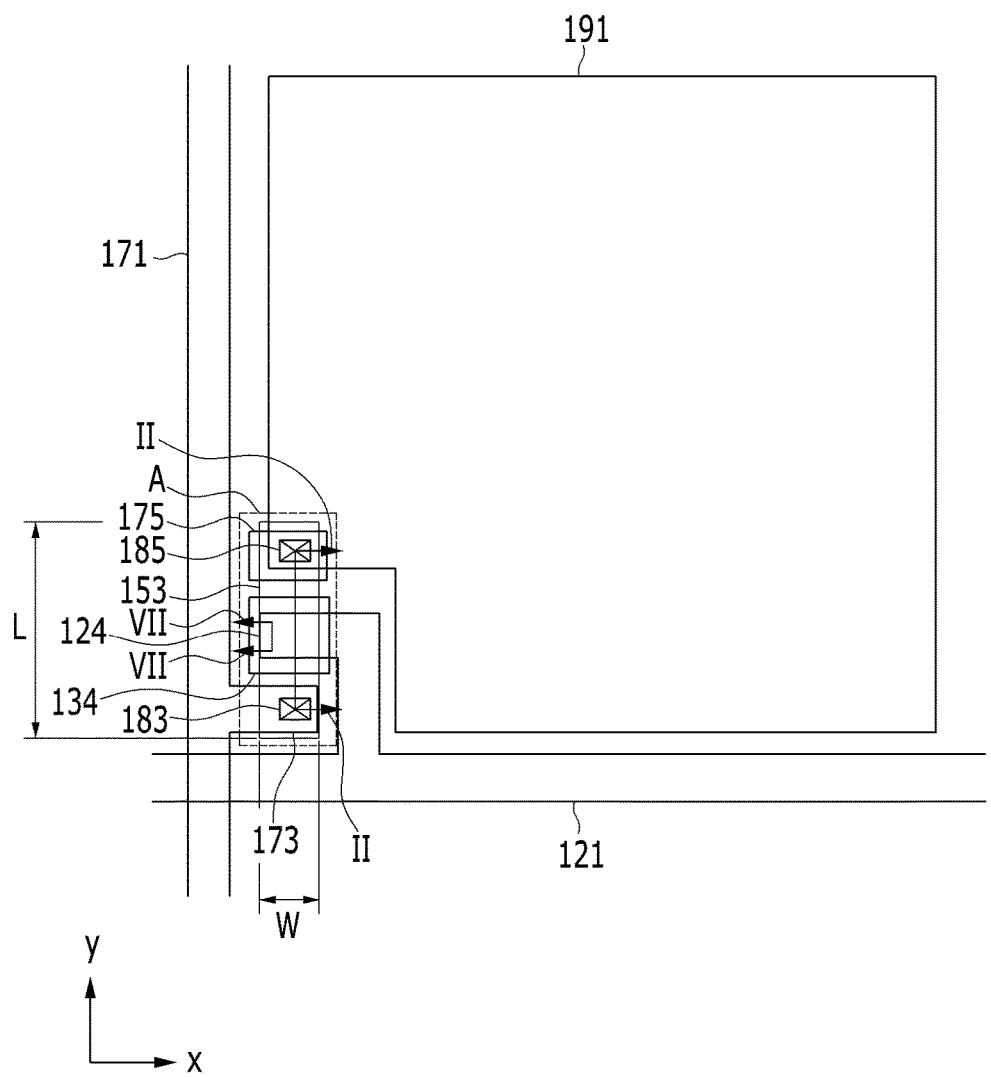
FIG. 1 is a top plan view illustrating a thin film transistor array panel according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, a thin film transistor array panel according to an exemplary embodiment will be described in detail with reference to the accompanying drawings.

Figure 2:
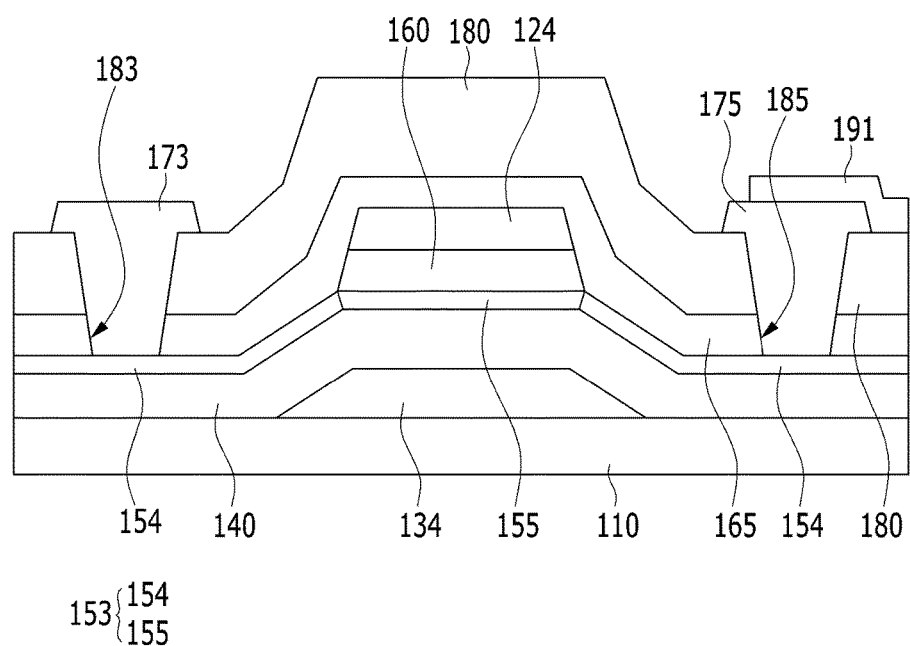
FIG. 2 is a cross-sectional view taken along a line II-II of FIG. 1.

FIG. 1 is a top plan view illustrating a thin film transistor array panel according to an exemplary embodiment, and FIG. 2 is a cross-sectional view taken along a line II-II of FIG. 1.

Referring to FIG. 1 and FIG. 2, a light-blocking film 134 is disposed on a substrate 110, which, for example, may be transparent glass or plastic.

The light-blocking film 134 may be formed as a single layer or multiple layers (a multilayer), and may include a conductive material such as molybdenum, chromium, tantalum, titanium, or copper, or an alloy thereof. Alternatively, the light-blocking film 134 may include an organic insulating material, an inorganic insulating material, or the like. The light-blocking film 134 blocks light that reaches a channel 155 of a semiconductor layer 153 to prevent deterioration of channel characteristics of a thin film transistor, such as a leakage current.

The light-blocking film 134 illustrated in FIG. 1 has a separate island-like shape. However, according to another exemplary embodiment, the light-blocking film 134 may be connected with a drain electrode 175, or may be connected with a gate electrode 124. Such exemplary embodiments will be described later.

The light-blocking film 134 may be overlapped with the drain electrode 175 and a source electrode 173, as described later, or, as illustrated in FIG. 1 and FIG. 2, may be overlapped with a region of the channel 155 of the semiconductor layer 153 and may not be overlapped with the source electrode 173 and the drain electrode 175.

A first insulating layer 140 may be disposed on the light-blocking film 134. The first insulating layer 140 may include an organic insulating material or an inorganic insulating material. The first insulating layer 140 may include $SiO_X$ or $AlO_X$. In addition, the first insulating layer 140 may include an insulating material having a hydrogen content.

The semiconductor layer 153 is disposed on the first insulating layer 140. The semiconductor layer 153 may include an oxide semiconductor or polysilicon. The oxide semiconductor may be a metal oxide semiconductor including an oxide of a metal such as zinc (Zn), indium (In), gallium (Ga), tin (Sn), or titanium (Ti), or a combination of metals of zinc (Zn), indium (In), gallium (Ga), tin (Sn), and titanium (Ti). For example, the oxide semiconductor may include at least one selected from a group including a zinc oxide (ZnO), a zinc-tin oxide (ZTO), a zinc-indium oxide (ZIO), an indium oxide (InO), a titanium oxide (TiO), an indium-gallium-zinc oxide (IGZO), and an indium-zinc-tin oxide (IZTO).

The semiconductor layer 153 includes the channel 155 and electrode regions 154. In the semiconductor layer 153, the channel 155 is disposed at a center of the semiconductor layer 153, and the electrode regions 154 are disposed at opposite sides with regard to the channel 155. The channel 155 is a region that is overlapped with the gate electrode 124 and has a lower doping concentration than that of the electrode region 154.

The semiconductor layer 153 has a first length extending in a first direction y and a second length extending in a second direction x. In this case, the first length may be longer than the second length. In the semiconductor layer 153, the first length extending in the first direction y is referred to as a length L, and the second length extending in the second direction x is referred to as a width W. In the thin film transistor according to the present exemplary embodiment, in the semiconductor layer 153, the length L is greater than that of the width W.

A gate insulating layer 160 is disposed on the channel 155 of the semiconductor layer 153. The gate insulating layer 160 may include an insulating material. The gate insulating layer 160 is overlapped with the gate electrode 124 to be described later and the channel 155 of the semiconductor layer 153. However, the gate insulating layer 160 is not overlapped with the entire semiconductor layer 153. The gate insulating layer 160 is not overlapped with the source electrode 173 and the drain electrode 175.

A gate conductor including a gate line 121 and the gate electrode 124 is disposed on the gate insulating layer 160. The gate conductor may include an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). Alternatively, the gate conductor may have various kinds of metals or conductors. The gate conductor may have a multilayer structure.

In FIG. 1, the gate line 121 is extended in the second direction x to cross a data line 171 that is extended in the first direction y. A portion of the gate line 121 may serve as the gate electrode 124.

In FIG. 1, the first direction y has been illustrated as the direction in which the data line 171 is extended, and the second direction x has been illustrated as the direction in which the gate line 121 is extended. However, in another exemplary embodiment, a longitudinal direction of the semiconductor layer 153 may be set as the second direction x, and a width direction thereof may be set as the first direction y. In addition, the first direction y and the second direction x may not specify any particular direction The gate electrode 124 is overlapped with the channel 155 of the channel 155 of the semiconductor layer 153 and the light-blocking film 134. However, the gate electrode 124 is not overlapped with the source electrode 173 and the drain electrode 175. Accordingly, it is possible to prevent parasitic capacitance from being generated due to overlapping between the gate electrode 124 and the source electrode 173 and the drain electrode 175.

Referring to FIG. 1, in the thin film transistor array panel according to the present exemplary embodiment, an edge of the gate electrode 124 is aligned with an edge of the semiconductor layer 153. In the present specification, a phrase "being aligned" includes being aligned to have an error within an alignment error range that may be generated in the process, and the alignment error range may include a range of about 3 μm or less, specifically, about 1 μm or less.

Referring to FIG. 1, the gate electrode 124 extends through the semiconductor layer 153 in the width direction, but an end edge of the gate electrode 124 is substantially aligned with the edge of the semiconductor layer 153. In the present specification, a phrase "being substantially aligned" indicates being aligned within the alignment error range of 3 μm or less.

In this case, the semiconductor layer 153 which is overlapped with the gate electrode 124 serves as the region of the channel 155, and the edge of the gate electrode 124 is not protruded over the edge of the channel 155. As a result, the edges of the gate electrode 124 and the channel 155 are vertically aligned in a direction perpendicular to the substrate. Such a structure will be described in detail later with reference to a separate drawing.

Next, a second insulating layer 165 is disposed on the gate conductor and the semiconductor layer 153. The second insulating layer 165 may include SiNx. Alternatively, the second insulating layer 165 may be formed as a double layer including lower SiNx and upper SiOx. In the present exemplary embodiment, the second insulating layer 165 may include SiNx containing an excessive amount of hydrogen.

Since the second insulating layer 165 is disposed on the gate conductor and the semiconductor layer 153, the second insulating layer 165 contacts the electrode region 154 of the semiconductor layer 153, and impurities included in the second insulating layer 165 are doped into the electrode region 154. In the doping operation, a method such as a heat treatment may be employed. As such, as the impurities included in the second insulating layer 165 are doped into the electrode region 154, the electrode region 154 of the semiconductor layer 153 contacting the second insulating layer 165 has a conductor characteristic having strong conductivity. However, since the channel 155 of the semiconductor layer 153 is overlapped with the gate electrode 124, the channel 155 does not directly contact the second insulating layer 165. Accordingly, the impurities of the second insulating layer 165 are not doped into the channel 155.

As a result, an impurity concentration of the channel 155 of the semiconductor layer 153 is lower than that of the electrode region 154 of the semiconductor layer 153. For example, the channel 155 of the semiconductor layer 153 has a doping concentration of about $1 \times E^{+16}$, and the electrode region 154 of the semiconductor layer 153 which is overlapped with the gate electrode 124 may have a doping concentration of about $1 \times E^{+20}$.

A third insulating layer 180 may be disposed on the second insulating layer 165. The third insulating layer 180 may include $SiN_X$ or $AlO_X$. However, the third insulating layer 180 may be omitted.

The second insulating layer 165 and the third insulating layer 180 respectively have a first contact hole 183 and a second contact hole 185 that are overlapped with the electrode region 154 of the semiconductor layer 153. The first contact hole 183 and the second contact hole 185 are respectively disposed at opposite sides with respect to the channel 155 of the semiconductor layer 153.

The data line 171 and the drain electrode 175 are disposed on the third insulating layer 180. The data line 171 may be formed as a single layer or a multilayer, and may include a conductive material such as molybdenum, chromium, tantalum, titanium, or copper, or an alloy thereof.

The data line 171 is extended in the first direction y to cross the gate line 121, and a portion of the data line 171 is protruded in the second direction x to serve as the source electrode 173. The drain electrode 175 may be formed in a same process as that when the data line 171 is formed, and thus may include the same material as that of the data line 171.

The source electrode 173 and the drain electrode 175 are disposed interposing the gate electrode 124 therebetween without being overlapped with the gate electrode 124. The source electrode 173 is connected with the electrode region 154 of the semiconductor layer 153 through the first contact hole 183, and the drain electrode 175 is connected with the electrode region 154 of the semiconductor layer 153 through the second contact hole 185.

A pixel electrode 191 is disposed on the third insulating layer 180. The pixel electrode 191 may include a transparent conductive material such as an indium tin oxide or an indium zinc oxide, or a reflective metal such as aluminum, silver, or an alloy thereof.

A portion of the pixel electrode 191 is physically and electrically connected to the drain electrode 175.

As described above, in the thin film transistor array panel according to the present exemplary embodiment, the edges of the gate electrode 124 and the channel 155 are vertically aligned in the direction perpendicular to the substrate. Specifically, the gate electrode 124 is overlapped with the channel 155 of the semiconductor layer 153, and the gate electrode 124 and the channel 155 are not overlapped with each other when viewed from a side surface of the channel 155. As a result, an influence of the gate electrode 124 can be reduced at the side surface of the channel 155, and distortion of an energy band can be prevented at an edge of the channel 155.

Hereinafter sizes and positional relationships of the gate electrode 124 and the semiconductor layer 153 with the channel 155 according to an exemplary embodiment will be described in detail with reference to the accompanying drawings.

Figure 3:
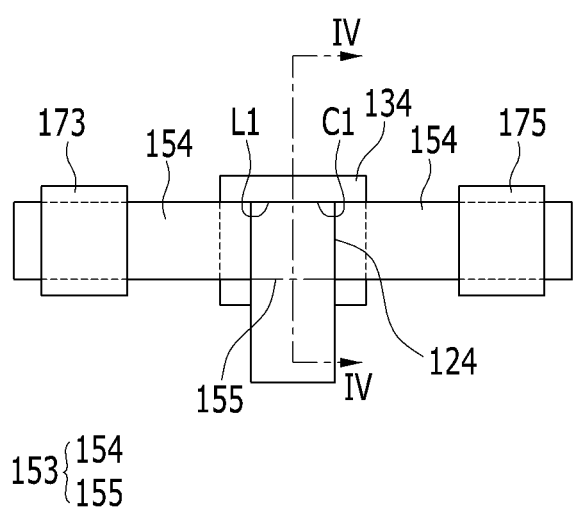
FIG. 3 is a schematic view illustrating an area A of FIG. 1.
Figure 4:
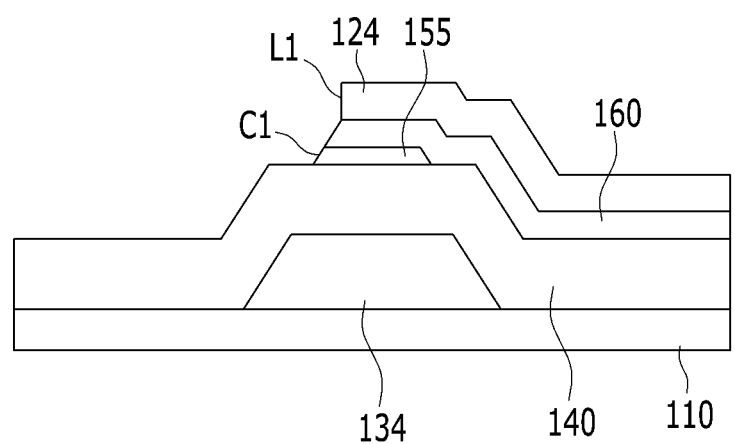
FIG. 4 is cross-sectional view taken along a line IV-IV of FIG. 3.

FIG. 3 and FIG. 4 illustrate a thin film transistor according to an example. FIG. 3 is a schematic view illustrating an area A of FIG. 1. FIG. 4 is cross-sectional view taken along a line IV-IV of FIG. 3.

Figure 5:
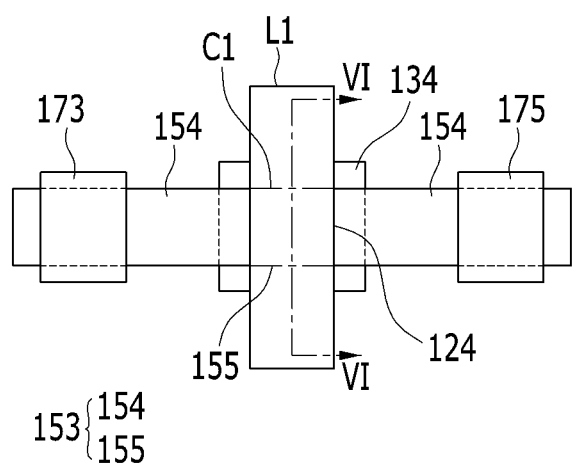
FIG. 5 illustrates an area of a thin film transistor according to a comparative example, which corresponds to the view of FIG. 3.
Figure 6:
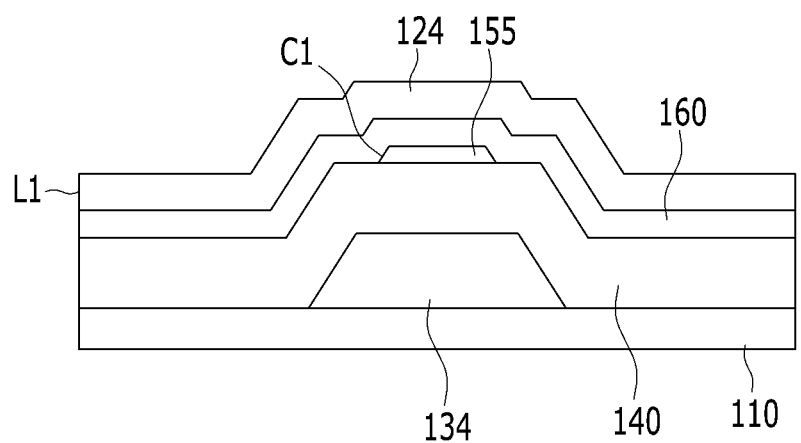
FIG. 6 is a cross-sectional view taken along a line VI-VI of the comparative example of FIG. 5.

FIG. 5 and FIG. 6 illustrate a thin film transistor according to a comparative example. FIG. 5 illustrates an area of a thin film transistor according to the comparative example, which corresponds to FIG. 3. FIG. 6 is a cross-sectional view taken along a line VI-VI of FIG. 5.

Referring to FIG. 3, in the example, a first edge L1 of the gate electrode 124 of the thin film transistor array panel and a second edge C1 of the channel 155 are overlapped with each other, and thus when viewed from a plane that is perpendicular to the surface of the substrate 110, the first edge L1 of the gate electrode 124 and the second edge C1 of the channel 155 substantially coincide. As described above, in the semiconductor layer 153, a direction of a longer width is referred to as a longitudinal direction, and a direction of a narrower width is referred to as a width direction. The source electrode 173 and drain electrode 175 are disposed to overlap opposite ends of the semiconductor layer 153 in the longitudinal direction, and the gate electrode 124 is disposed to overlap the semiconductor layer 153 in the width direction.

FIG. 4 illustrates a width-directional cross-section of the semiconductor layer 153. Referring to FIG. 4, the first edge L1 of the gate electrode 124 is not protruded further compared with the second edge C1 of the channel 155. As a result, an edge of the channel 155 is not covered by the gate electrode 124.

In other words, at least one side surface of the channel 155 parallel to the longitudinal direction of the semiconductor layer 153 is not overlapped with the gate electrode 124. Accordingly, the channel 155 is overlapped with the gate electrode 124 in a direction that is perpendicular to the substrate, and is not overlapped with the gate electrode 124 when viewed from a side surface of the channel 155.

However, referring to FIG. 5 and FIG. 6, in the thin film transistor array panel according to the comparative example, the first edge L1 of the gate electrode 124 is protruded further compared with a width direction of the semiconductor layer 153. As a result, as shown in FIG. 6, the first edge L1 of the gate electrode 124 is protruded further compared with the second edge C1 of the channel 155.

Accordingly, opposite sides of the channel 155 are overlapped with the gate electrode 124. As a result, the channel 155 is affected not only by the gate electrode 124 overlapping in the direction perpendicular to the substrate but also by the gate electrode 124 overlapping both sides of the channel 155.

As such, when the channel 155 is affected by the gate electrode 124 on the top and both sides, the center of the channel 155 is affected by the gate electrode 124 disposed on the top surface, while an edge region of the channel 155 is affected by the gate electrode 124 disposed on the top and side surfaces. Thus, an electron's balance band and a conduction band are warped at opposite edges of the channel 155 and distortion occurs, and recombination of electrons and holes more frequently occurs at the edges than at the center of the channel 155. This results in a reduction in the number of electrons and holes recombined in the entire channel 155, resulting in a decrease in current, and efficiency of the thin film transistor may be deteriorated.

However, in the thin film transistor array panel according to the present exemplary embodiment, the first edge L1 of the gate electrode 124 is not protruded as compared with the width direction of the semiconductor layer 153. As a result, the second edge C1 of the channel 155 is substantially vertically aligned with the first edge L1 of the gate electrode 124. A distance between the second edge C1 of the channel 155 and the first edge L1 of the gate electrode 124 is 3 μm or less.

Thus, an influence of the gate electrode 124 can be reduced at the side surface of the channel 155, and distortion of an energy band of electrons can be prevented.

As a result, in the present exemplary embodiment, the edge of the gate electrode 124 is vertically aligned with the edge of the semiconductor layer 153 that is parallel to the longitudinal direction.

However, in the exemplary embodiment of FIG. 1 to FIG. 4, it has been described that the edge of the gate electrode 124 is not protruded further compared with the edge of the semiconductor layer 153 that is parallel to the longitudinal direction. However, in another exemplary embodiment, the edge of the gate electrode 124 may be protruded further compared with the edge of the semiconductor layer 153 that is parallel to the longitudinal direction. However, in this case, a distance between the edges is within a process alignment error range. The alignment error range may be about 3 μm or less. As such, when separated from each other within the process alignment error range, the edges are included in the range of being substantially aligned with each other.

As such, in the thin film transistor array panel according to the present exemplary embodiment, at least one side surface of the channel 155 is not overlapped with the gate electrode 124. In this case, a side surface of the channel 155 that is not overlapped with the gate electrode 124 may be one of side surfaces of the semiconductor layer 153 that are parallel to the longitudinal direction.

Figure 7:
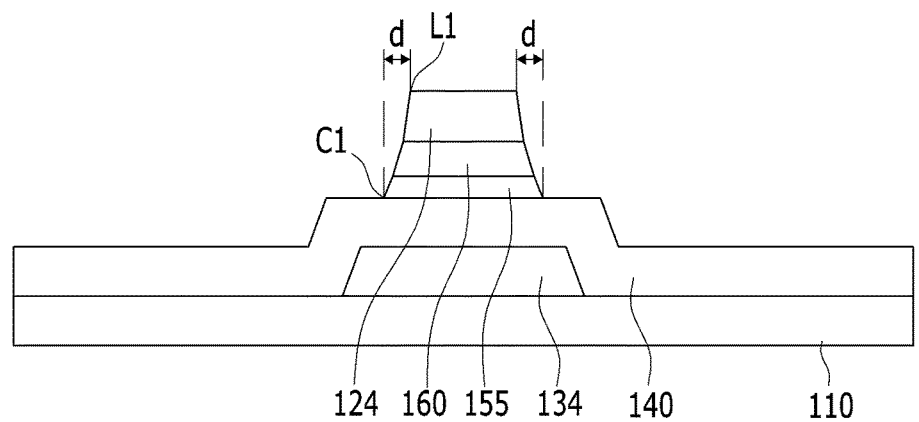
FIG. 7 is a cross-sectional view taken along a line VII-VII of FIG. 1.

Next, the thin film transistor array panel according to the exemplary embodiment of FIG. 1 will be described in detail with reference to FIG. 7. FIG. 7 is a cross-sectional view taken along a line VII-VII of FIG. 1. In the exemplary embodiment of FIG. 7, a width in the width direction of the gate electrode 124 is narrower than that of the width direction of the channel 155. However, in this case, since the gate insulating layer 160 between the gate electrode 124 and the channel 155, the channel 155 does not contact the gate electrode 124.

Further, the distance d between the first edge L1 of the gate electrode 124 and the second edge C1 of the channel 155 is within 3 μm.

Figure 8:
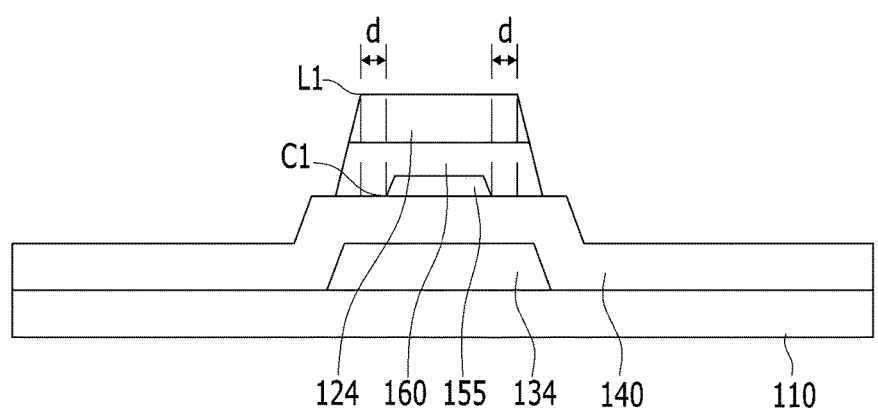
FIG. 8 is a cross-sectional view illustrating an area of a thin film transistor array panel according to another exemplary embodiment, which corresponds to FIG. 7.

A thin film transistor array panel according to another exemplary embodiment will be described with reference to FIG. 8. FIG. 8 is a cross-sectional view illustrating an area of the thin film transistor array panel according to the present exemplary embodiment, corresponding to FIG. 7.

In the exemplary embodiment of FIG. 8, it is illustrated that the width in the width direction of the gate electrode 124 is wider than that in the width direction of the channel 155. In the exemplary embodiment of FIG. 8, the first edge L1 of the gate electrode 124 is protruded further compared with the second edge C1 of the channel 155. However, in this case, the distance d between the first edge L1 of the gate electrode 124 and the second edge C1 of the channel 155 is within 3 μm. This is within a typical process error range, and the influence of the gate electrode (124) on the channel (155) plane is at a slight level.

In addition, in the thin film transistor array panel according to the exemplary embodiment of FIG. 8, the side surface of the channel 155 is not overlapped with the gate electrode 124.

As in the exemplary embodiments of the FIG. 7 and FIG. 8, the width of the gate insulating layer 160 may coincide with that of the gate electrode 124. The gate insulating layer and the gate electrode may be formed to have different widths when a halftone mask is used in patterning of the gate insulating layer 160 and the gate electrode 124 or when patterning using separate masks is performed to form the gate insulating layer 160 and the gate electrode 124. However, even when the gate insulating layer 160 and the gate electrode 124 are patterned using one mask, the gate insulating layer and the gate electrode may be formed to have different widths due to errors in the etching process.

As such, according to the thin film transistor array panel of the present exemplary embodiment, the first edge L1 of the gate electrode 124 is substantially vertically aligned with an edge of the semiconductor layer 153, i.e., the second edge C1 of the channel 155. The distance between the first edge L1 of the gate electrode 124 and the second edge C1 of the channel 155 is 3 μm or less, and thus it is possible to prevent distortion of an energy band caused by the influence of the gate electrode 124 from the side surface of the channel 155, and thus it is possible to prevent a thus-generated current reduction and deterioration of efficiency of the thin film transistor.

Figure 9:
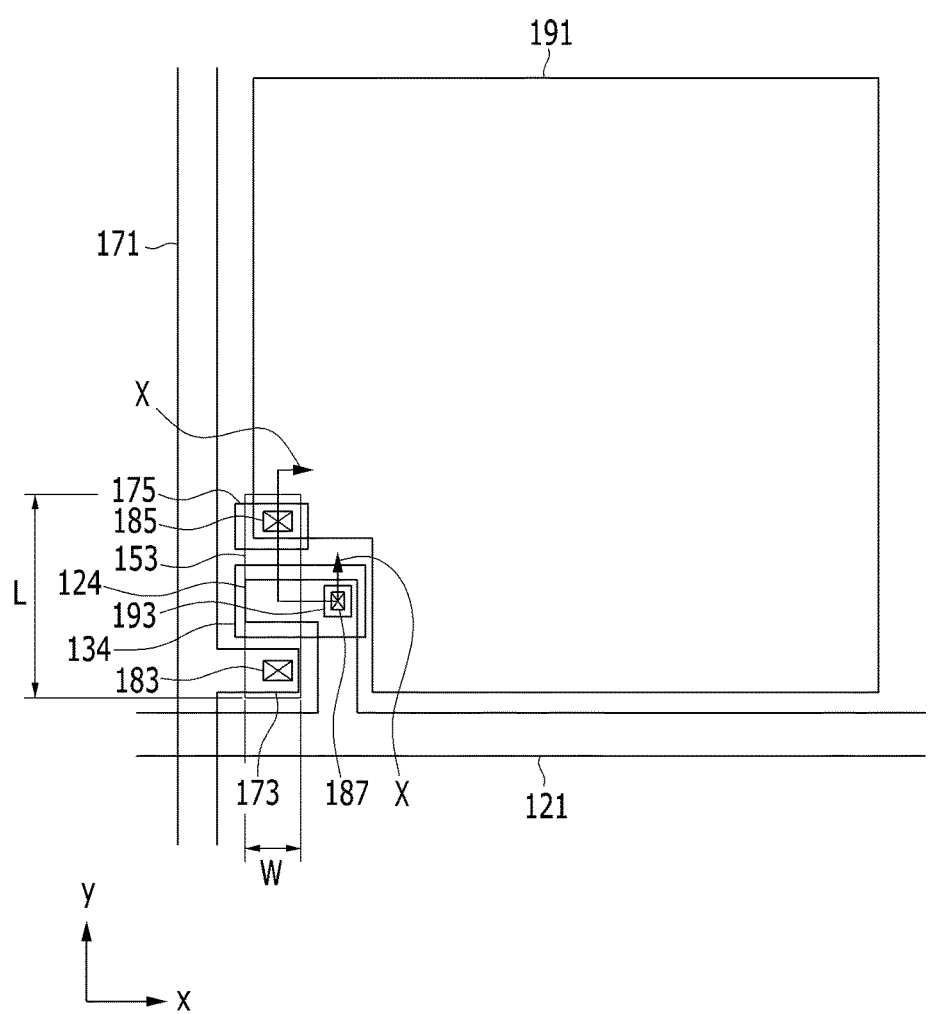
FIG. 9 is a top plan view illustrating one pixel of a thin film transistor array panel according to another exemplary embodiment.

Hereinafter, a thin film transistor array panel according to another exemplary embodiment will be described with reference to FIG. 9 and FIG. 10. FIG. 9 is a top plan view illustrating a pixel of the thin film transistor array panel according to the present exemplary embodiment, and FIG. 10 is a cross-sectional view taken along a line X-X of FIG. 9.

Figure 10:
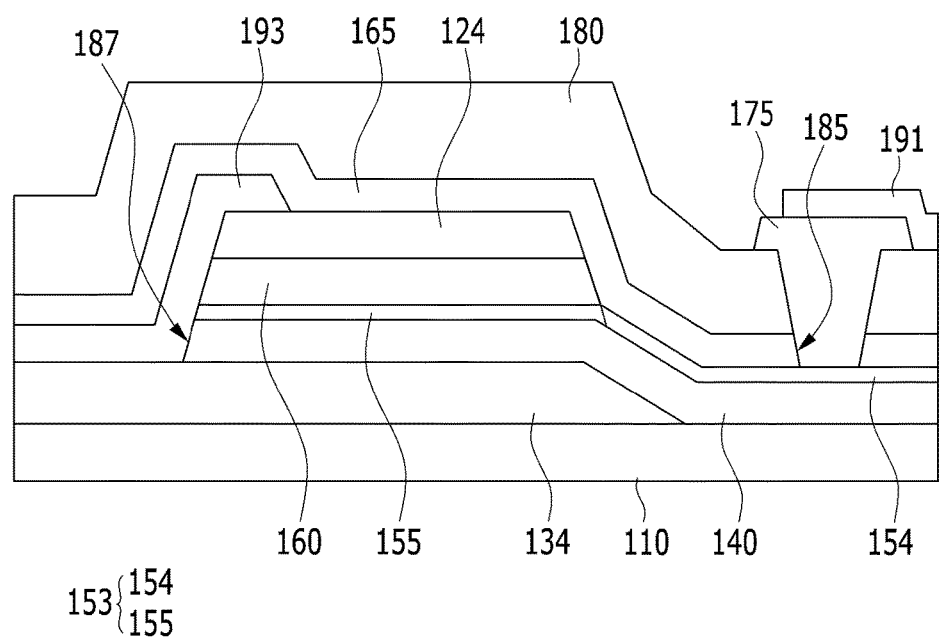
FIG. 10 is a cross-sectional view taken along a line X-X of FIG. 9.

Referring to FIG. 9 and FIG. 10, the thin film transistor array panel according to the present exemplary embodiment is similar to that of the thin film transistor array panel of FIG. 1 and FIG. 2. A detailed description of similar constituent elements will be omitted.

However, in the thin film transistor array panel according to the present exemplary embodiment, the light-blocking film 134 is connected with the gate electrode 124 through a connecting electrode 193, unlike the thin film transistor array panel of the exemplary embodiment of FIG. 1 and FIG. 2.

Referring to FIG. 9 and FIG. 10, the first insulating layer 140 and the gate insulating layer 160 have third contact holes 187 that are formed to overlap the light-blocking film 134. The connecting electrode 193 is disposed on the gate electrode 124, and is physically and electrically connected to the light-blocking film 134 through a third contact hole 187.

Accordingly, the light-blocking film 134 receives a gate voltage supplied to the gate electrode 124 through the gate line 121, and serves as a gate. Therefore, the thin film transistor array panel according to the present embodiment can operate as a dual gate.

Similar to the thin film transistor array panel according to the aforementioned exemplary embodiment, according to the thin film transistor array panel of the present exemplary embodiment, the first edge L1 of the gate electrode 124 may be substantially vertically aligned with an edge of the semiconductor layer 153, i.e., the second edge C1 of the channel 155. The distance between the first edge L1 of the gate electrode 124 and the second edge C1 of the channel 155 is 3 µm or less, and thus it is possible to prevent distortion of an energy band caused by the influence of the gate electrode 124 from the side surface of the channel 155, and thus it is possible to prevent a thus-generated current reduction and deterioration of efficiency of the thin film transistor.

Figure 11:
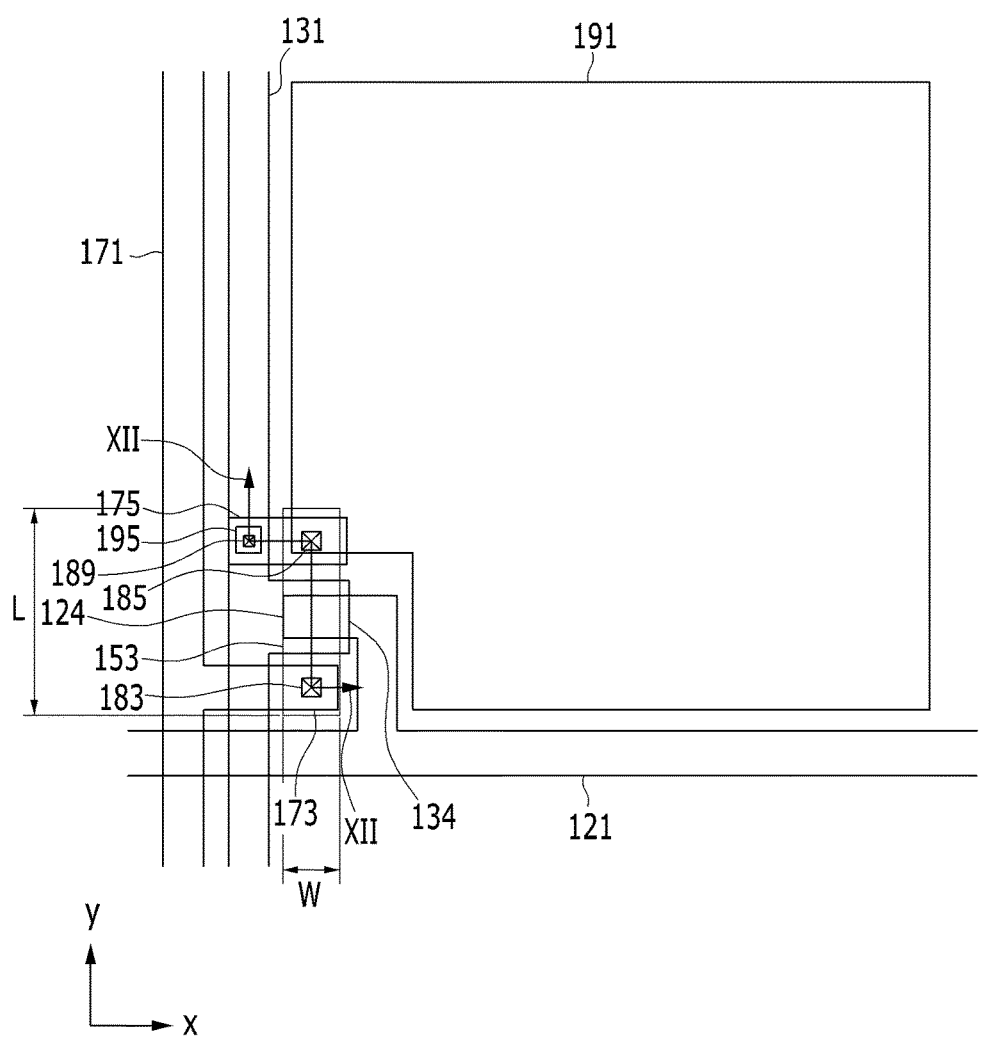
FIG. 11 is a top plan view illustrating one pixel of a thin film transistor array panel according to another exemplary embodiment.

Many features of the thin film transistor array panel according to the above-described embodiments are applicable to the thin film transistor array panel according to the present embodiment, Hereinafter, a thin film transistor array panel according to another exemplary embodiment will be described with reference to FIG. 11 and FIG. 12. FIG. 11 is a top plan view illustrating a pixel of the thin film transistor array panel according to the present exemplary embodiment, and FIG. 12 is a cross-sectional view taken along a line XII-XII of FIG. 11.

Figure 12:
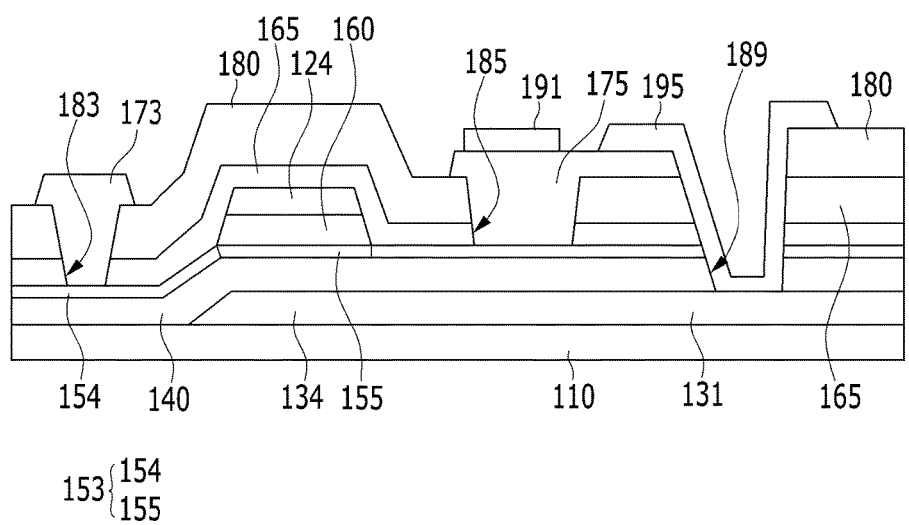
FIG. 12 is a cross-sectional view taken along a line XII-XII of FIG. 11.

Referring to FIG. 11 and FIG. 12, the thin film transistor array panel according to the present exemplary embodiment is similar to that of the thin film transistor array panel of FIG. 1 and FIG. 2

A detailed description of similar constituent elements will be omitted.

However, the thin film transistor array panel according to the present exemplary embodiment includes a voltage line 131 disposed in a direction that is parallel to the data line 171 and a portion of the voltage line 131 serves as the light-blocking film 134, unlike the thin film transistor array panel of the exemplary embodiment of FIG. 1 and FIG. 2. In addition, the voltage line 131 is physically and electrically connected to the drain electrode 175 through fourth contact holes 189 and an auxiliary electrode 195.

Specifically, referring to FIG. 11 and FIG. 12, the first insulating layer 140, the second insulating layer 165, and the third insulating layer 180 have the fourth contact holes 189 which are partially overlapped with the voltage line 131. The auxiliary electrode 195 is connected with the drain electrode 175, and is partially connected with the voltage line 131 through the fourth contact holes 189.

A ground voltage of 0 V is supplied to the voltage line 131. The ground voltage of 0 V supplied to the voltage line 131 is supplied to the drain electrode 175 through the auxiliary electrode 195. As a result, it may operate as a thin film transistor in which the drain electrode 175 and the voltage line 131 are connected with each other.

Similar to the thin film transistor array panel according to the aforementioned exemplary embodiment, according to the thin film transistor array panel of the present exemplary embodiment, the first edge L1 of the gate electrode 124 may be substantially vertically aligned with an edge of the semiconductor layer 153, i.e., the second edge C1 of the channel 155. The distance between the first edge L1 of the gate electrode 124 and the second edge C1 of the channel 155 is 3 µm or less, and thus it is possible to prevent distortion of an energy band caused by the influence of the gate electrode 124 from the side surface of the channel 155, and thus it is possible to prevent a thus-generated current reduction and deterioration of efficiency of the thin film transistor.

Many features of the thin film transistor array panel according to the above-described embodiments are applicable to the thin film transistor array panel according to the present embodiment.

As such, in the thin film transistor array panel according to the exemplary embodiments, an edge of the gate electrode 124 is substantially vertically aligned with an edge of the channel 155 of the semiconductor layer 153. As a result, an edge of the channel 155 is not overlapped with the gate electrode 124, and thus an influence of the gate electrode 124 on a side surface of the semiconductor layer 153 and a thus-generated efficiency deterioration of the thin film transistor may be prevented.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A thin film transistor array panel, comprising:
   a substrate;
   a semiconductor layer disposed on the substrate;
   a gate electrode disposed on the semiconductor layer; and
   a source electrode and a drain electrode disposed on the semiconductor layer to not overlap the gate electrode,
   wherein a first edge of the gate electrode is aligned with a second edge of the semiconductor layer in a direction that is perpendicular to the substrate, and
   wherein, in a plan view of the semiconductor layer:
   a first width in a first direction is wider than a second width in a second direction that is perpendicular to the first direction;
   a portion of the semiconductor layer serves as a channel;
   the channel is overlapped with the gate electrode in a direction that is perpendicular to the substrate; and
   an edge of the channel parallel to the first direction is not overlapped with the gate electrode at a side surface of the channel.

2. The thin film transistor array panel of claim 1, wherein a distance between the first edge of the gate electrode and the second edge of the semiconductor layer is within 3 µm.

3. The thin film transistor array panel of claim 1, further comprising a light-blocking film disposed between the substrate and the semiconductor layer.

4. The thin film transistor array panel of claim 3, wherein the light-blocking film is not overlapped with the source electrode and a drain electrode.

5. The thin film transistor array panel of claim 3, wherein a portion of the light-blocking film is connected with the gate electrode.

6. The thin film transistor array panel of claim 3, further comprising a voltage line disposed between the substrate and the semiconductor layer,
   wherein the light-blocking film is a portion of the voltage line, and
   a portion of the light-blocking film is connected with the drain electrode.

7. The thin film transistor array panel of claim 6, wherein the voltage line is configured to receive a ground voltage of 0 V.

8. The thin film transistor array panel of claim 1, wherein the semiconductor layer comprises an oxide semiconductor.

9. The thin film transistor array panel of claim 1, further comprising a gate insulating layer disposed between the semiconductor layer and the gate electrode,
   wherein the gate insulating layer is not overlapped with the source electrode and a drain electrode.

10. The thin film transistor array panel of claim 1, further comprising a pixel electrode connected with a portion of the drain electrode.

* * * * *